(12) United States Patent
Brown et al.

(10) Patent No.: US 9,148,092 B1
(45) Date of Patent: Sep. 29, 2015

(54) MONOLITHIC INTEGRATION OF FIELD-PLATE AND T-GATE DEVICES

(71) Applicant: HRL Laboratories, LLC, Malibu, CA (US)

(72) Inventors: David F. Brown, Woodland Hills, CA (US); Miroslav Micovic, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 112 days.

(21) Appl. No.: 13/971,827

(22) Filed: Aug. 20, 2013

(51) Int. Cl.
| H01L 21/338 | (2006.01) |
| H01L 29/15 | (2006.01) |
| H03F 1/26 | (2006.01) |
| H01L 29/06 | (2006.01) |
| H01L 29/40 | (2006.01) |

(52) U.S. Cl.
CPC .............. *H03F 1/26* (2013.01); *H01L 29/0607* (2013.01); *H01L 29/402* (2013.01)

(58) Field of Classification Search
CPC ..... H01L 29/402; H01L 29/0607; H01F 1/26; H03F 1/26
USPC ............................................. 438/172; 257/76
See application file for complete search history.

(56) References Cited

U.S. PATENT DOCUMENTS

| 2003/0183844 | A1* | 10/2003 | Yokoyama et al. | 257/192 |
| 2012/0146107 | A1* | 6/2012 | Lim et al. | 257/288 |
| 2014/0061659 | A1* | 3/2014 | Teplik et al. | 257/76 |

* cited by examiner

*Primary Examiner* — Long K Tran
(74) *Attorney, Agent, or Firm* — Ladas & Parry

(57) ABSTRACT

A method of fabricating amplifiers, includes monolithically integrating a field-plate transistor and T-gate transistor on a single wafer. A device includes a monolithically integrated field-plate transistor and T-gate transistor on a single wafer.

27 Claims, 15 Drawing Sheets

MONOLITHIC INTEGRATION OF FIELD-PLATE AND T-GATE DEVICES

BACKGROUND

In making Transmit/Receive ("T/R") chips, one limitation frequently encountered is the same transistor may not be optimal for both transmit and receive functions. For optimal transmission applications, higher output power is desired. Such a characteristic may be provided by a power amplifier utilizing "field-plate" devices with high breakdown voltage. For optimal receiver applications, on the other hand, high dynamic range, low noise figure, and high RF survivability may be desired. Such characteristics may be provided by low-noise amplifiers utilizing high-frequency "T-gate" devices.

GaN HEMTs are good candidates for applications in high-power, solid-state, mm-wave power amplifiers because of the high electron velocity and high breakdown voltage of the material. GaN is also promising for robust receiver applications which require high dynamic range, low noise figure, and high RF survivability.

However, integration of T-gate and field-plate devices has not been demonstrated previously for GaN wafers due to the relative immaturity of GaN technology compared to other material systems, combined with inherent processing challenges. Furthermore, the use of traditional gate fabrication processing techniques to integrate T-gate and field-plate devices is not straightforward since it will require two separate lithography and metal evaporation processes, which can lead to reduced yield.

While components can be fabricated on separate wafers and then assembled in a hybrid module in which a power amplifier on a "field-plate" is fabricated on one wafer and an LNA on a separate "T-gate" wafer, such a hybrid module may be substantially larger than a single-chip approach, integrating separate chips requires additional design & assembly at module level and there may be some insertion loss at each transition (e.g. wire-bonds) between the separate chips and the hybrid components.

SUMMARY

An aspect of the technology relates to monolithically integrating a field-plate transistor and T-gate transistor on a single wafer.

Another aspect of the technology relates to a device that includes a monolithically integrated field-plate transistor and T-gate transistor on a single wafer.

DETAILED DESCRIPTION

This disclosure relates to monolithic integration of field-plate and T-gate devices. Some embodiments include a structure with both types of devices on a single wafer. Some embodiments include a method for providing field-plate and T-gate devices on a single wafer. In some embodiments, the method for providing monolithically integrated field-plate and T-gate devices provides increased yield.

In a following description, reference is made to the accompanying drawings, which form a part hereof, and in which is shown by way of illustration a specific example in which the disclosure may be practiced. It is to be understood that other embodiments may be utilized and structural changes may be made without departing from the scope of the present disclosure.

General Overview:

It should be noted that the descriptions that follow, for example, in terms of a method of monolithically integrating a field-plate transistor and T-gate transistor on a single wafer is described for illustrative purposes and the underlying system can apply to any number and multiple types of electronic parts including field-plate transistors and T-gate transistors. Monolithically integrating can refer to a device that includes T-gate and field-plate transistors together, or to a method that provides such a device. In some embodiments, monolithically integrating can include simultaneous metallization of two very different gate structures (T-gate & field-plate), combined with the metallization technique in which ALD-deposited Pt and electroplating are used. In some embodiments, monolithic integration refers to providing the T-gate and field-plate transistors on the same wafer. In some embodiments, it can also refer, for example, to forming features of T-gate and field-plate transistors together, in the same process/method/sequence/step(s), at the same time, or in parallel. In some embodiments, monolithic integration can refer to forming features of the T-gate and field-plate transistors on the same wafer. In one embodiment the method of monolithically integrating a field-plate transistor and T-gate transistor on a single wafer can be configured using a single wafer including a silicon carbide (SiC) substrate containing an epitaxial semiconductor layer of gallium nitride (GaN). The method of monolithically integrating a field-plate transistor and T-gate transistor on a single wafer can be configured to include two or more sacrificial dummy-gate structures and can be configured to include using a first and a second metallization processes using predefined metals using the present disclosure.

Figure 1:
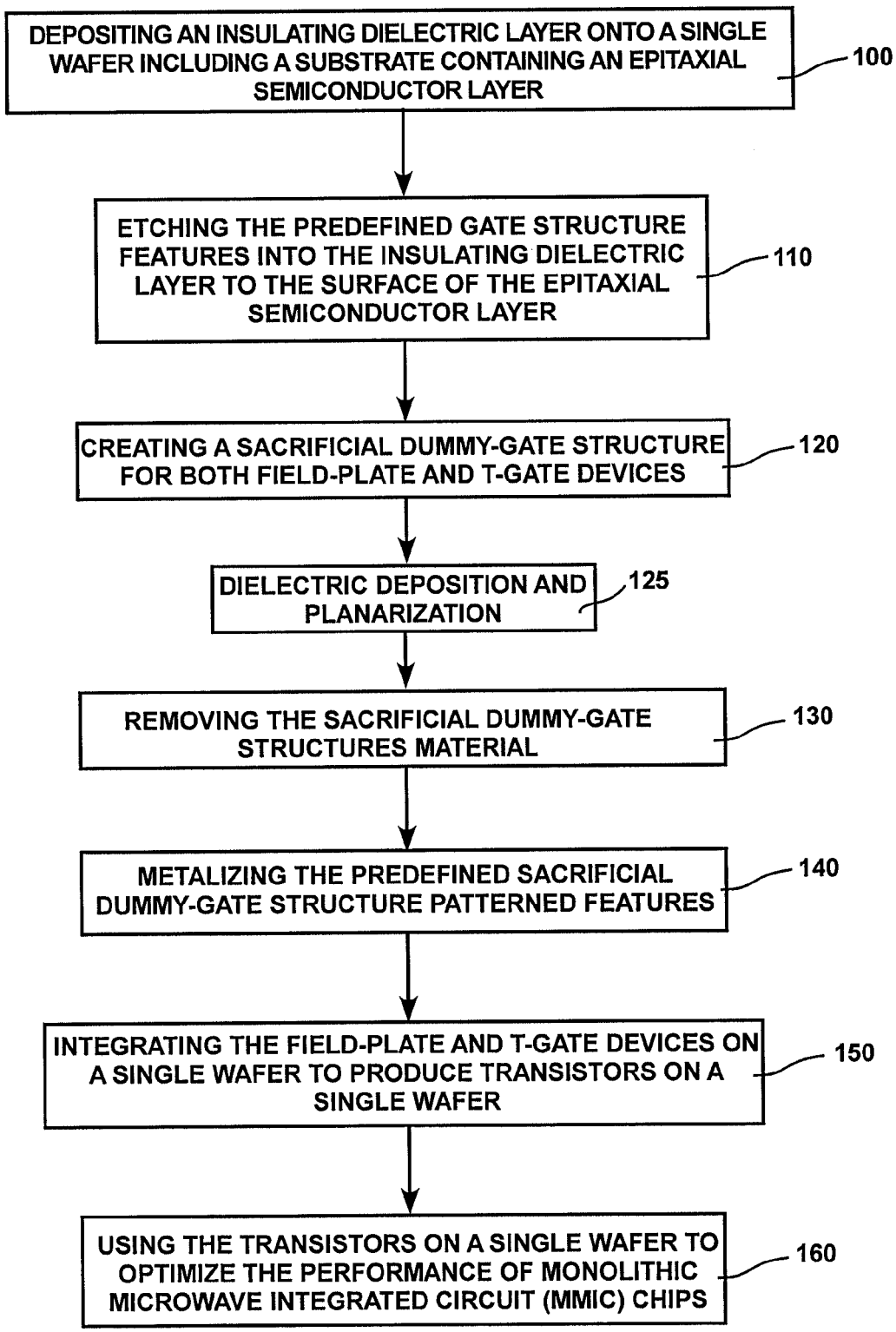
FIG. 1 shows a block diagram of an overview of a method of monolithically integrating a field-plate transistor and T-gate transistor on a single wafer of one embodiment.

FIG. 1 shows a block diagram of an overview of a method of monolithically integrating a field-plate transistor and T-gate transistor on a single wafer of one embodiment. FIG. 1 shows depositing an insulating dielectric layer onto a single wafer including a substrate containing an epitaxial semiconductor layer 100. The insulating dielectric layer passivates the surface and supports the field-plate. Etching the predefined gate structure features into the insulating dielectric layer to the surface of the epitaxial semiconductor layer 110 includes a gate foot for T-gate devices. The etched predefined gate structure features can be used in creating a sacrificial dummy-gate structure for both field-plate and T-gate devices 120 of one embodiment.

The sacrificial dummy-gate structures can be used to define both field-plate and T-gate device dimensions. The sacrificial dummy-gate structures can be fabricated using materials to duplicate the definition of the devices. Lithographic processes can be used to set the definitions of the field-plate and T-gate devices created using the sacrificial dummy-gate structures of one embodiment.

In some embodiments, an encapsulating dielectric layer may be deposited on the sacrificial dummy-gate structures and the surface planarized so that it is substantially flat 125. In some embodiments, planarization also exposes the dummy-gate material.

The completion of the lithographic formation of the sacrificial dummy-gate structures patterns is followed by removing the sacrificial dummy-gate structures material 130. The creation of the predefined gate structure features includes one or more stages. The lithographic formed patterns of the field-plate and T-gate devices defined dimensions can be used as guides for metallizing the predefined sacrificial dummy-gate structure patterned features 140. The metallizing the predefined sacrificial dummy-gate structure patterned features 140 includes two or more metallization processes of one embodiment.

Upon completion of the metallization processes the field-plate and T-gate devices can be integrated using one or more integration process. The integration processes can be used to reduce the parasitic capacitance in these devices and obtain higher operating frequency. The integration processes complete integrating the field-plate and T-gate devices on a single wafer to produce transistors on a single wafer 150. Transistors produced on a single wafer using the monolithically Integrated field-plate and T-gate devices enables using the transistors on a single wafer to optimize the performance of monolithic microwave integrated circuit (MMIC) chips 160 of one embodiment.

Integration of field-plate transistors and T-gate transistors on a single wafer optimizes the performance from multifunction MMIC chips, such as T/R modules. Field-plate devices have higher breakdown voltage and output power (suitable for power amplification), while T-gate devices have higher gain and lower noise figure (suitable for a low-noise amplifier). Integrating the field-plate and T-gate devices on a single wafer to produce transistors on a single wafer 150 enables the symbiotic advantages to be achieved of one embodiment.

The creation of both types of devices on a single wafer enables the advantages gained wherein low-noise amplifiers have a lower noise figure when high-frequency T-gate devices are used; while power amplifiers have higher output power when field-plate devices with high breakdown voltage are used. The use of transistors in devices produced using the integrated field-plate and T-gate devices on a single wafer includes Transmit/Receive (T/R) Modules, Power Amplifiers, Low-Noise Amplifiers, Mixers, RF Switches, and D to A converters of one embodiment.

DETAILED DESCRIPTION

Figure 2:
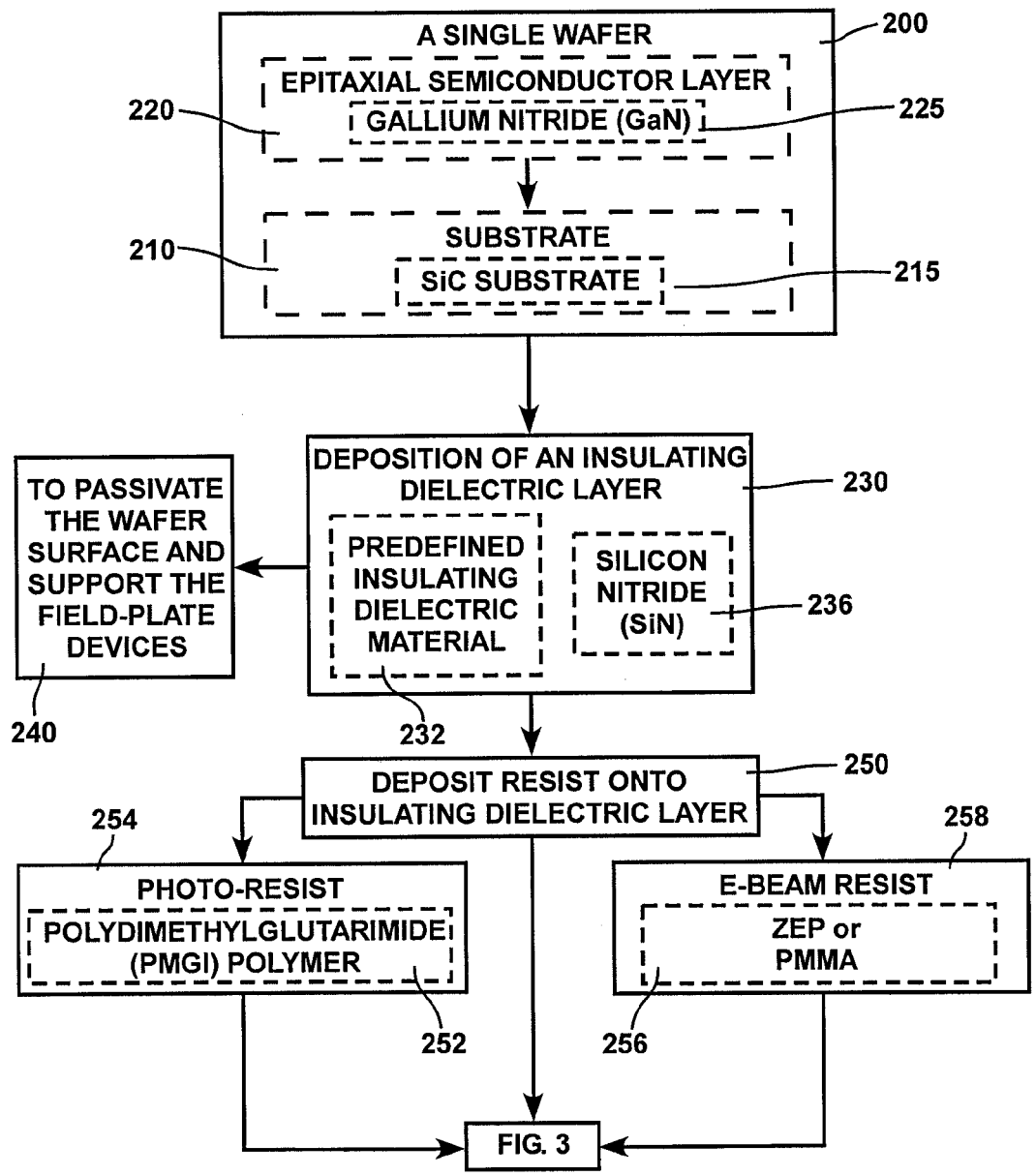
FIG. 2 shows a block diagram of an overview flow chart of a method of monolithically integrating a field-plate transistor and T-gate transistor on a single wafer of one embodiment.

FIG. 2 shows a block diagram of an overview flow chart of a method of monolithically integrating a field-plate transistor and T-gate transistor on a single wafer of one embodiment. FIG. 2 shows a single wafer 200 including a substrate 210. The single wafer 200 can also include an epitaxial semiconductor layer 220. The substrate 210 can be a silicon carbide substrate 215, for example. The epitaxial semiconductor layer 220 can include gallium nitride (GaN) 225, for example. Deposition of an insulating dielectric layer 230 such as a predefined insulating dielectric material 232 can passivate the wafer surface and support the field-plate devices 240. The predefined insulating dielectric material 232 can include silicon nitride (SiN) 236, for example. The deposition of an insulating dielectric layer 230 can include plasma-enhanced chemical vapor deposition (PECVD). The process 250 deposits resist onto insulating dielectric layer. Depositing resist onto insulating dielectric layer 250 includes either depositing a photo-resist 254, such as polydimethylglutarimide (PMGI) polymers 252, for example, or alternatively, includes depositing an e-beam resist 258 such as ZEP or poly(methyl methacrylate) (also known as PMMA) 256, for example, in one or more embodiments. The ZEP may be ZEP 520A, for example.

Figure 3:
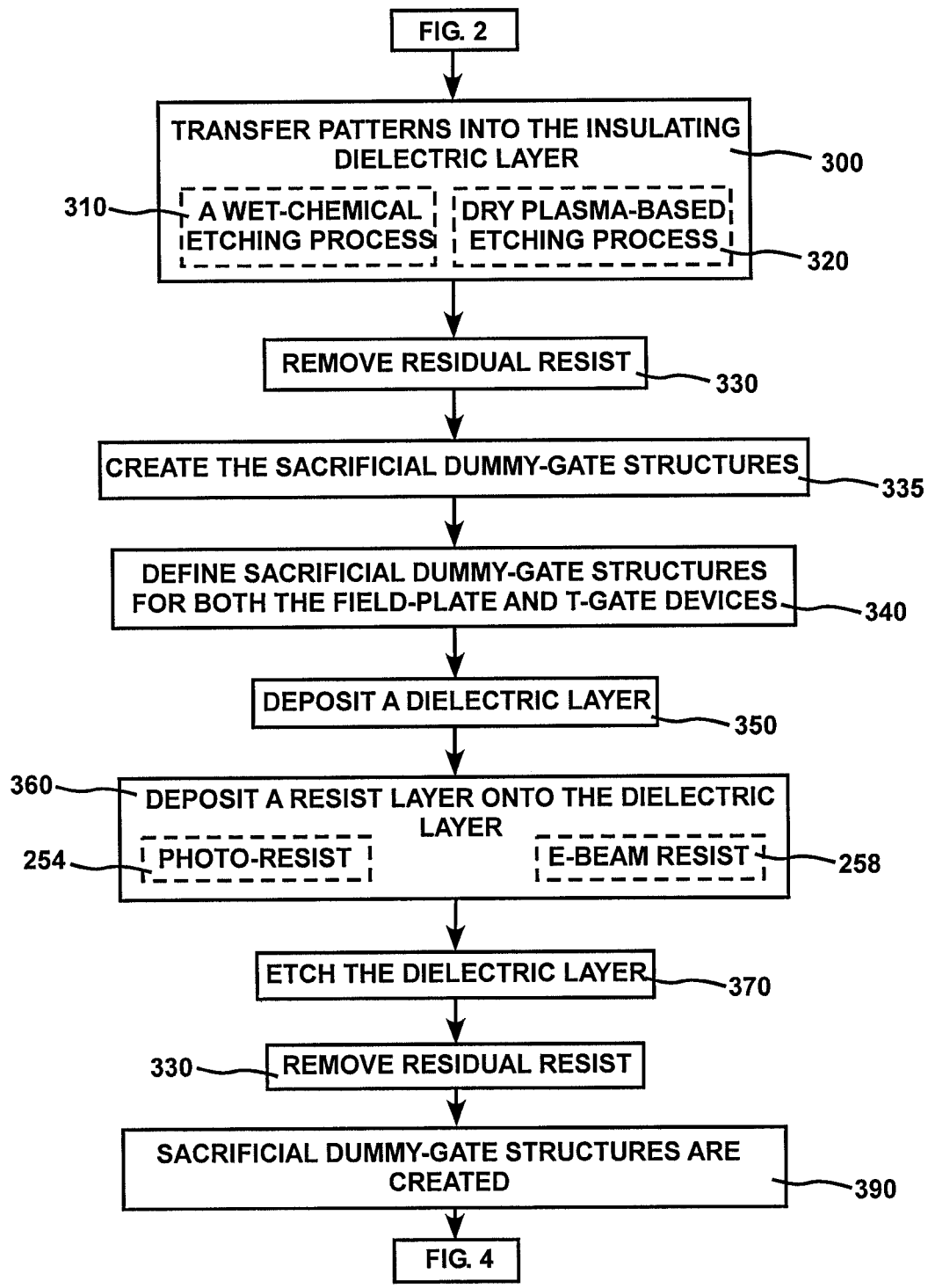
FIG. 3 shows a block diagram of an overview flow chart of a sacrificial dummy-gate structure defining process of one embodiment.

The processing proceeds as described in FIG. 3.

Sacrificial Dummy-Gate Structure Defining Process:

FIG. 3 shows a block diagram of an overview flow chart of a sacrificial dummy-gate structure defining process of one embodiment. FIG. 3 shows a continuation of the processes described in FIG. 2 including a process to transfer patterns into the insulating dielectric layer 300, which includes processes such as a wet-chemical etching process 310 or a dry plasma-based etching process 320, for example. The process to transfer patterns into the insulating dielectric layer 300 may be followed by a process to remove residual resist 330 in one or more embodiments.

The processing includes creating the sacrificial dummy-gate structures 335. The creation of the sacrificial dummy-gate structures defines a sacrificial dummy-gate structure for both the field-plate and T-gate devices 340. The definition process includes a process to deposit a dielectric layer 350 followed by a process to deposit a resist layer onto the dielectric layer 360. The deposition of a resist includes using a photo-resist 254 that includes polydimethylglutarimide (PMGI) polymer 252 of FIG. 2, for example or, alternatively, an e-beam resist 258 such as ZEP or PMMA, for example, as indicated in FIG. 2. A lithography process may be used to pattern the resist using a dummy-gate structure definition of the field-plate and T-gate devices in one or more embodiments.

A lithography process may be used to etch the dielectric layer 370 using a dummy-gate structure definition of the field-plate and T-gate devices. A process may be used to remove residual resist 330 used for the lithography process. Upon completion of the lithography processes, sacrificial dummy-gate structures are created 390 in one embodiment. The dummy-gate structures correspond to the shape of the gate and prevent other layers from filling in the area the gate(s) will occupy, thereby allowing its formation in subsequent steps, for example. The process proceeds as described in FIG. 4.

Figure 4:
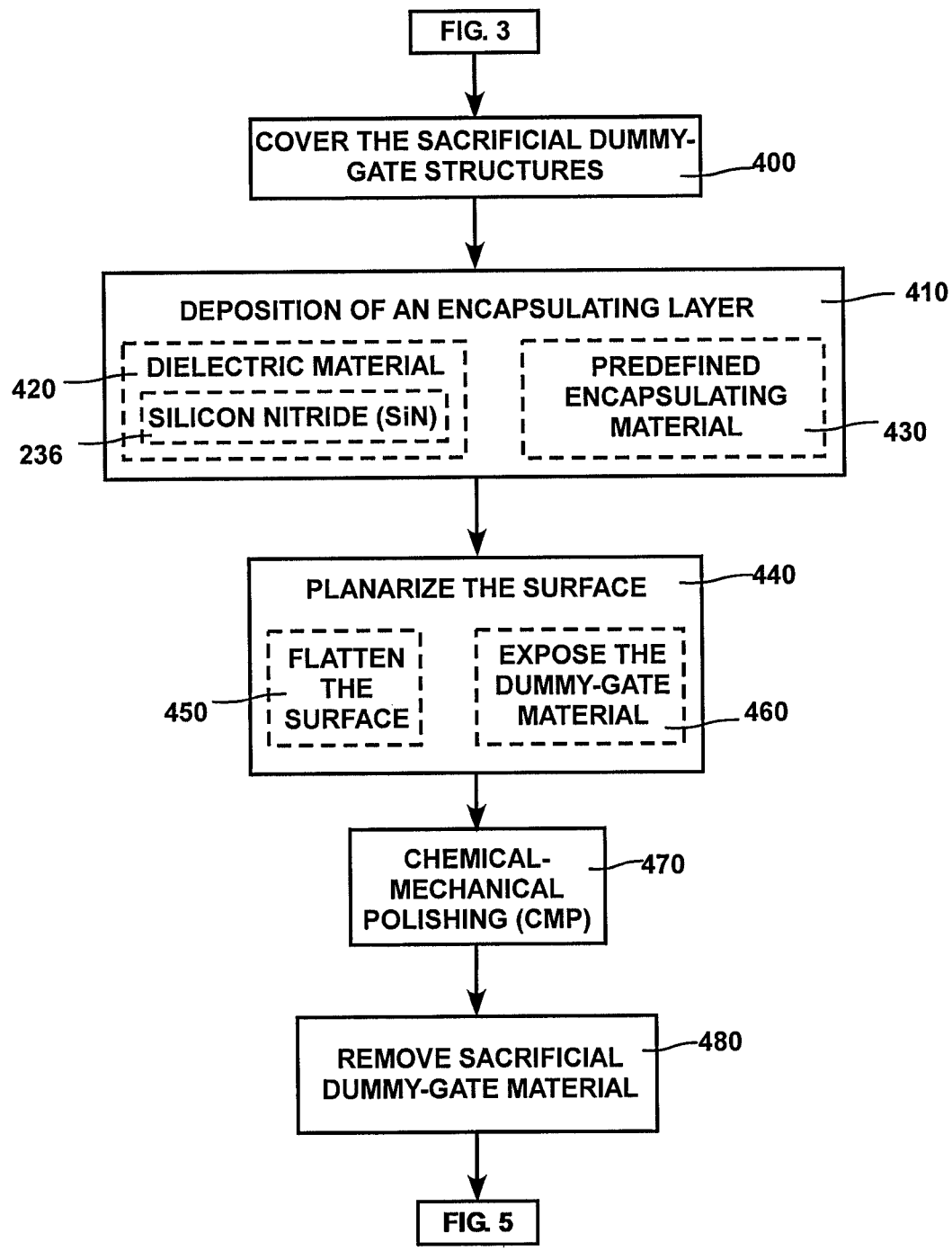
FIG. 4 shows a block diagram of an overview flow chart of a deposition of an encapsulating layer of one embodiment.

Deposition of an Encapsulating Layer:

FIG. 4 shows a block diagram of an overview flow chart of a deposition of an encapsulating layer in one or more embodiments. FIG. 4 shows descriptions of processes continuing from those shown in FIG. 3. A process may be used to cover the sacrificial dummy-gate structure 400 using a deposition of an encapsulating layer 410, for example. The deposition of an encapsulating layer 410 include using a dielectric material 420 and/or a predefined encapsulating material 430, for example in one or more embodiments. The dielectric material 420 can be silicon nitride (SiN) 236, for example.

A planarization process including chemical-mechanical polishing (CMP) 470 may be used to planarize the surface 440. The planarization process may be used to flatten the surface 450 and to expose the dummy-gate material 460. The planarized encapsulating layer surrounds and preserves the definition of the sacrificial dummy-gate structures. A process may be used including a wet-chemical etching process to remove sacrificial dummy-gate material 480 in one or more embodiments. Descriptions of the processes continue in FIG. 5.

Figure 5:
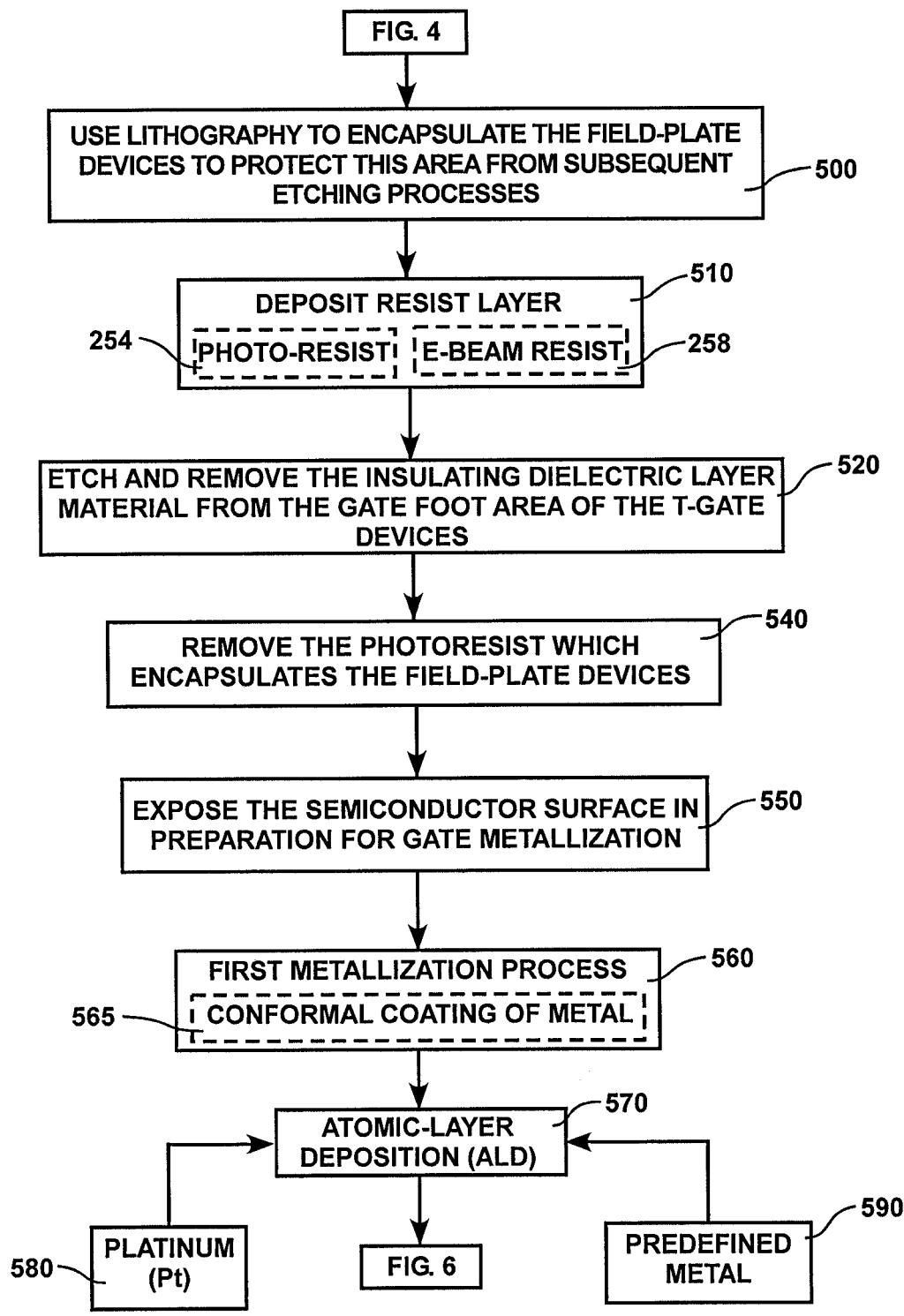
FIG. 5 shows a block diagram of an overview flow chart of a first metallization process of one embodiment.

First Metallization Process:

FIG. 5 shows a block diagram of an overview flow chart of a first metallization process in one or more embodiments. FIG. 5 shows a continuation of the processes illustrated in FIG. 4. Processing includes performing lithography in order to encapsulate the field-plate devices to protect this area from subsequent etching processes 500. This includes depositing resist layer 510, which includes using a resist material such as a photo-resist 254 or an e-beam resist 258, for example. A process may be used to etch and remove the insulating dielectric layer material from the gate foot area of the T-gate devices 520. A process may be used to remove the photoresist which encapsulates the field-plate devices 540.

A first metallization process 560 includes conformal coating of metal 565 for a portion of the gate metal. The conformal coating of metal 565 includes using a deposition process such as atomic-layer deposition (ALD) 570, for example. The conformal coating of metal 565 includes using a predefined metal 590 such as platinum (Pt) 580 in one or more embodiments, for example. Processing descriptions continue in FIG. 6.

Figure 6:
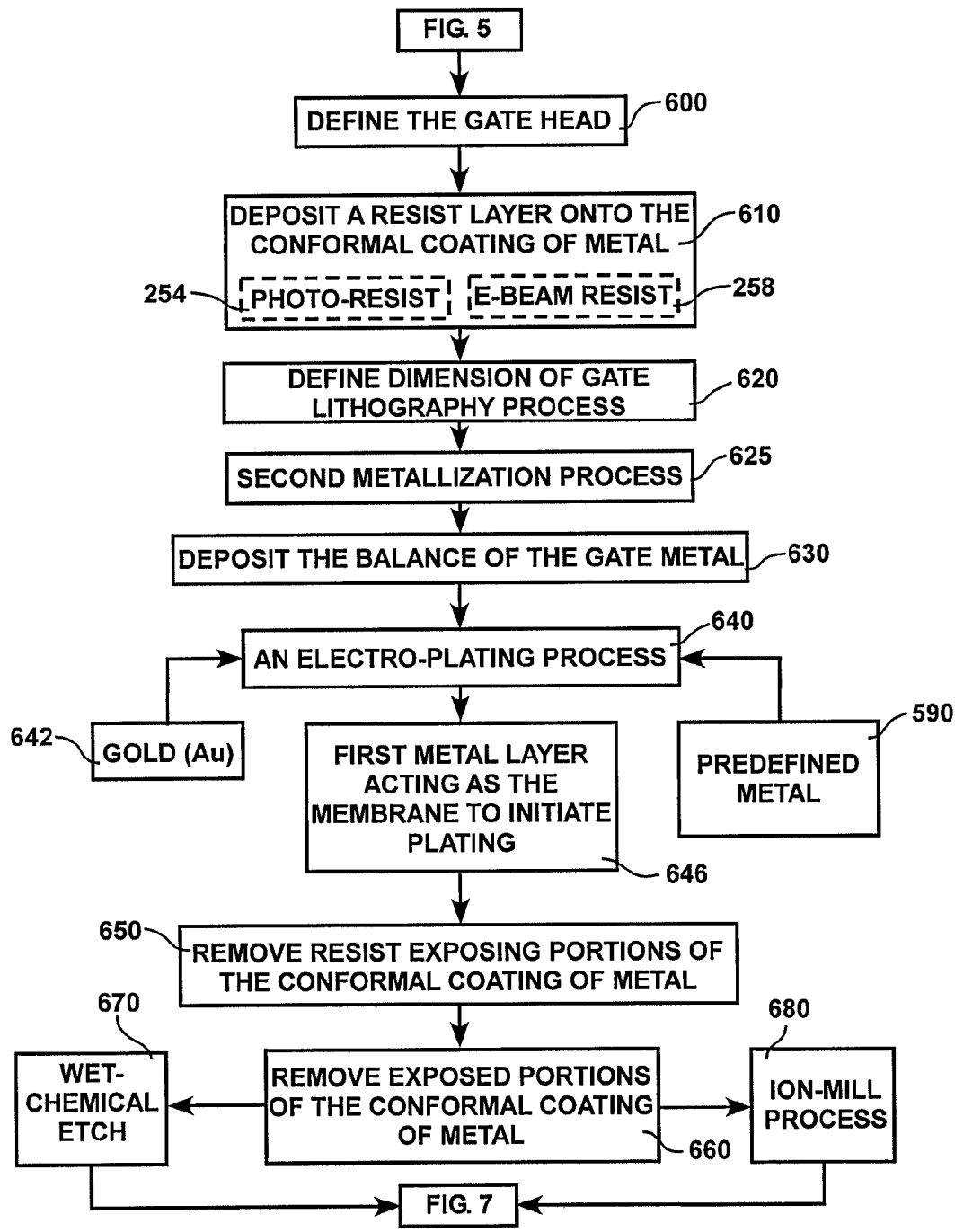
FIG. 6 shows a block diagram of an overview flow chart of a second metallization process of one embodiment.

Second Metallization Process:

FIG. 6 shows a block diagram of an overview flow chart of a second metallization process in one or more embodiments. In a continuation from FIG. 5, FIG. 6 shows processes to define the gate head 600 of the sacrificial dummy-gate structures for both the field-plate and T-gate devices. A process may be used to deposit a resist layer onto the conformal coating of metal 610. The deposition of the resist layer includes using resist materials including photo-resist 254 and/or e-beam resist 258. A lithography process may be used to define the dimensions of the gate head(s) 620 in the deposited resist layer in one or more embodiments. In some embodiments, the dimensions of the gate head(s) 620 may be defined by a lithography process.

A second metallization process 625 includes a process to deposit the balance of the gate metal 630. The deposition of the balance of the gate metal includes an electro-plating process 640. The balance of the gate metal includes using a predefined metal 590 that can include gold (Au) 642, for example. The conformal coating of metal 565 of FIG. 5 is a first metal layer acting as the membrane to initiate plating 646 of the balance of the gate metal in one or more embodiments.

The processing includes removing resist exposing portions of the conformal coating of metal 650. A process may be used to remove exposed portions of the conformal coating of metal 660. Processes used to remove exposed portions of the conformal coating of metal 660 include a wet-chemical etch 670 and an ion-mill process 680 in one or more embodiments. The processing continues as described in FIG. 7

Figure 7:
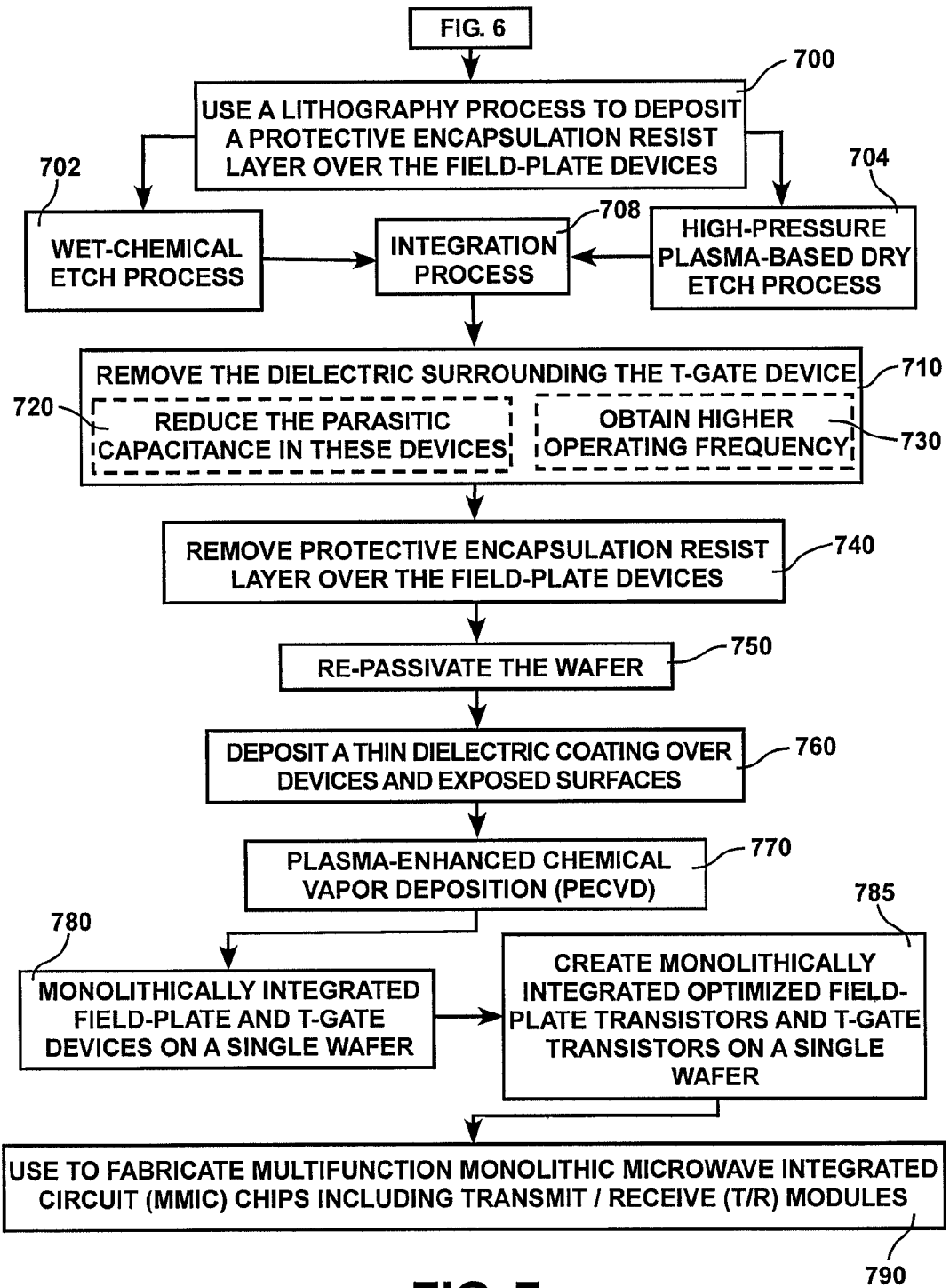
FIG. 7 shows a block diagram of an overview flow chart of an integration process of one embodiment.

Integration Process:

FIG. 7 shows a block diagram of an overview flow chart of an integration process in one or more embodiments. FIG. 7 shows processing continuing from FIG. 6. The method of monolithically integrating a field-plate transistor and T-gate transistor on a single wafer includes using a lithography process to deposit a protective encapsulation resist layer over the field-plate devices 700. A process may be used to deposit a resist layer over the field-plate devices. The protective encapsulating layer may be patterned using a lithography process. The lithography process removes the deposited resist material covering the T-gate device in one or more embodiments.

An integration process 708 begins by using a process to remove the dielectric surrounding the T-gate device 710 to reduce the parasitic capacitance in these devices 720 and obtain higher operating frequency 730. A process can be used to remove the dielectric surrounding the T-gate device 710 including using a etch process such as a wet-chemical etch process 702 or a high-pressure plasma-based dry etch process 704, for example. Other etch processes may be utilized. The material surrounding the T-gate device can be removed down to the epitaxial semiconductor layer in one or more embodiments.

A process can be used to remove protective encapsulation resist layer over the field-plate devices 740. A process can be used to re-passivate the wafer 750. The process to re-passivate the wafer 750 includes using a process to deposit a thin dielectric layer over devices and exposed surfaces 760 such as plasma-enhanced chemical vapor deposition (PECVD) 770, for example. Re-passivation of the wafer completes the creation of monolithically integrated field-plate and T-gate devices on a single wafer 780 in one or more embodiments.

The monolithically integrated field-plate and T-gate devices on a single wafer 780 can be used to create monolithically integrated field-plate transistors and T-gate transistors on a single wafer 785. Monolithically integrated field-plate transistors and T-gate transistors on a single wafer allows low-noise amplifiers to have a lower noise figure when high-frequency T-gate devices are used, while power amplifiers have higher output power when field-plate devices with high breakdown voltage are used. The method of monolithically integrating a field-plate device and T-gate device on a single wafer produces integrated field-plate and T-gate devices on a single wafer to produce transistors to use to fabricate multifunction monolithic microwave integrated circuit (MMIC) chips including transmit/receive (T/R) modules 790 and to optimize the performance of these and other electronic devices in one or more embodiments.

Sacrificial Dummy-Gate Structures Creation Processes:

FIG. 8 through FIG. 15 illustrate embodiments used in the method of monolithically integrating a field-plate device and T-gate device on a single wafer and may include in the following descriptions of specific examples of materials and/or processes in which the disclosure may be practiced for illustrative purposes. It is to be understood that other embodiments may be utilized and structural changes may be made without departing from the scope of the present disclosure.

Figure 8:
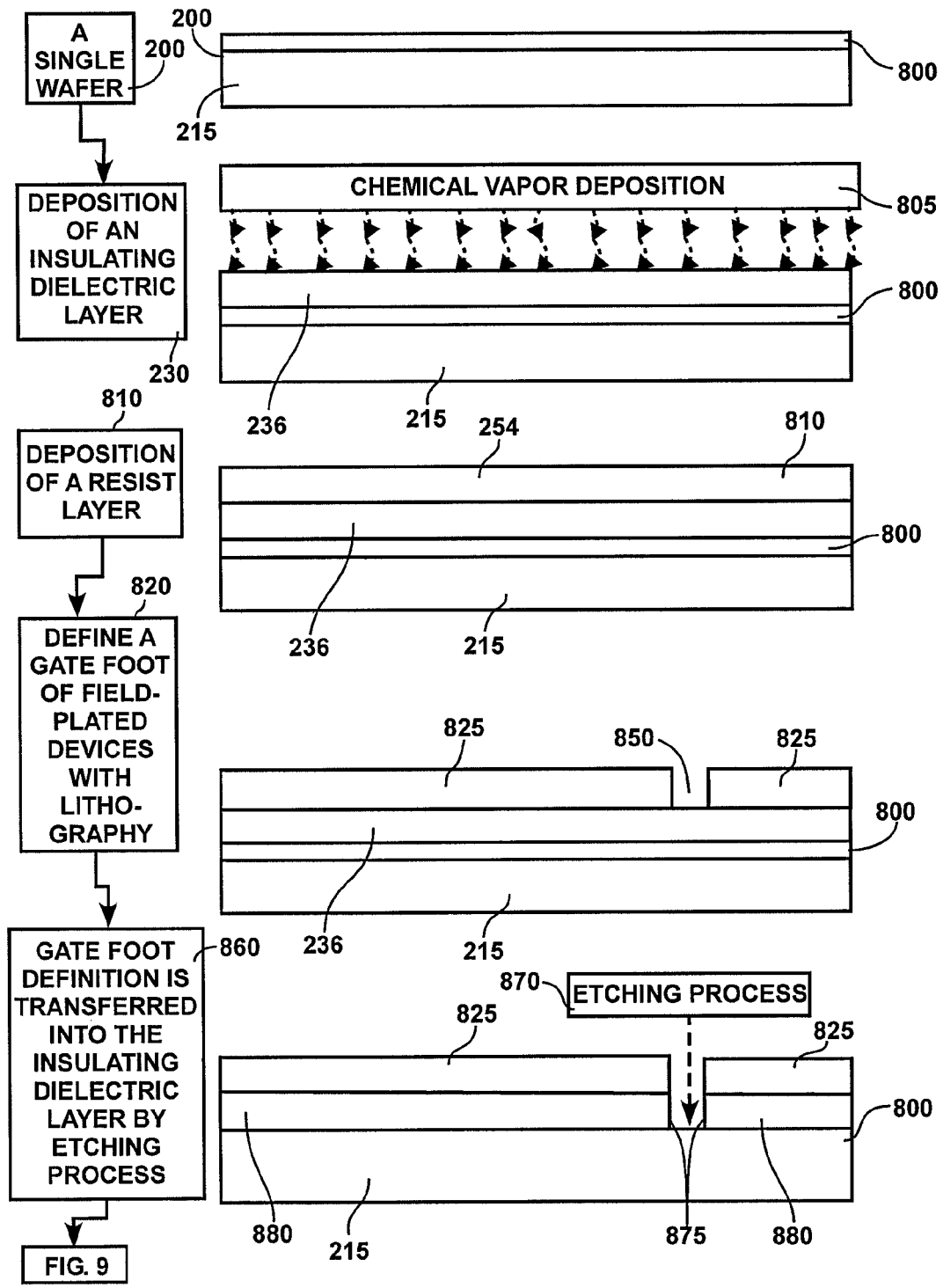
FIG. 8 shows for illustrative purposes only an example of sacrificial dummy-gate structures creation processes of one embodiment.

FIG. 8 shows for illustrative purposes only an example of sacrificial dummy-gate structures creation processes in one or more embodiments. FIG. 8 shows a single wafer 200 consisting of a silicon carbide substrate 215 and a gallium nitride (GaN) epitaxial semiconductor layer 800. A deposition of an insulating dielectric layer 230 can be made upon the single wafer 200. The insulating dielectric material can include silicon nitride (SiN) 236, for example. The deposition of an insulating dielectric layer step 230 includes using a chemical vapor deposition 805 process in one or more embodiments.

A deposition of a resist layer 810 may be made upon the deposition of an insulating dielectric layer 230. The deposition of a resist layer 810 includes using a photo-resist or e-beam resist 254. A lithography process may be used to define a gate foot of field-plated devices 820. When the pattern is processed, the field-plated devices gate foot is defined 850 in one or more embodiments.

Processing continues wherein a gate foot definition may be transferred into the insulating dielectric layer by etching process 860. An etching process 870 using the resist layer 825 as guides define the field-plated devices gate foot into the insulating dielectric layer. The etch process 870 exposes a portion of the gallium nitride (GaN) epitaxial semiconductor layer 800 where the insulating dielectric layer material may be removed 875. The field-plated devices gate foot definition extends through the resist layer 825 and etched insulating dielectric layer 880 in one or more embodiments. Descriptions of subsequent processes are shown in FIG. 9.

Figure 9:
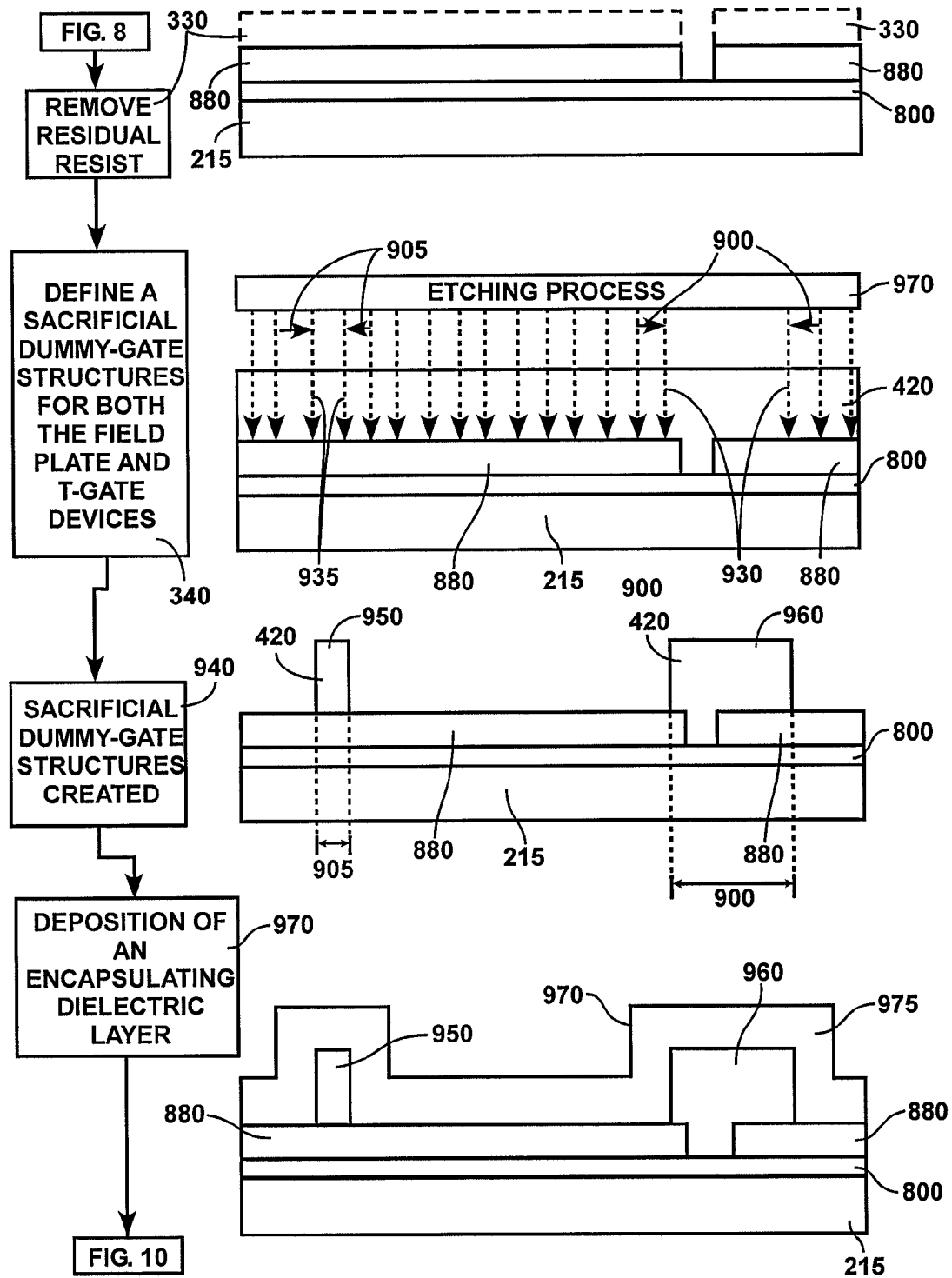
FIG. 9 shows for illustrative purposes only an example of defining sacrificial dummy-gate structures of one embodiment.

Defining Sacrificial Dummy-Gate Structures:

FIG. 9 shows for illustrative purposes only an example of defining sacrificial dummy-gate structures in one or more embodiments. FIG. 9 shows the subsequent processes following those shown in FIG. 8. A process may be used to remove residual resist 330 exposing the etched insulating dielectric layer 880. A portion of the gallium nitride (GaN) epitaxial semiconductor layer 800 may be exposed on the silicon carbide substrate 215 single wafer 200 of FIG. 2. A process may be used to define sacrificial dummy-gate structures for both the field-plate and T-gate devices 340 including the use of sacrificial dummy-gate structures for field-plate devices with dimensions 900 and T-gate devices with dimensions 905 in one or more embodiments. In some embodiments, the dimension for the field plate devices can be in the range of 100 nm to 250 nm, and dimensions for the T-gate devices can be between 40 nm and 150 nm.

A dielectric material 420 may be deposited onto the etched insulating dielectric layer 880. The deposition of the dielectric material 420 flows onto the exposed sections of the gallium nitride (GaN) epitaxial semiconductor layer 800 on the silicon carbide substrate 215. An etching process may be used to transfer the patterned sacrificial dummy-gate structures field-plate devices dimensions 900 and T-gate devices dimensions 905 into the dielectric material 420. The sacrificial dummy-gate structures field-plate devices etched dimensions and T-gate devices etched dimensions can define the sacrificial dummy-gate structures using the dielectric material 420 in one or more embodiments.

Sacrificial dummy-gate structures created 940 in the dielectric material 420 include a T-gate sacrificial dummy-gate structure 950 and a field-plate sacrificial dummy-gate structure 960. In some embodiments, the dielectric material 420 may comprise SiN, which can be deposited by plasma-enhanced chemical vapor deposition, for example. Alternatively, another deposition method may be used, and the dielectric material 420 can be any suitable insulating dielectric. The dummy-gate structure 950 can comprise SiO2, for example. Other materials may be used for the dummy-gate structure 950. Processing continues using a deposition of an encapsulating dielectric layer 970 onto the etched insulating dielectric layer 880. The deposition of an encapsulating dielectric layer 970 creates an encapsulating layer 975 that can surrounding the T-gate sacrificial dummy-gate structure 950 and the field-plate sacrificial dummy-gate structure 960 in one or more embodiments. The processing continues as described in FIG. 10.

Figure 10:
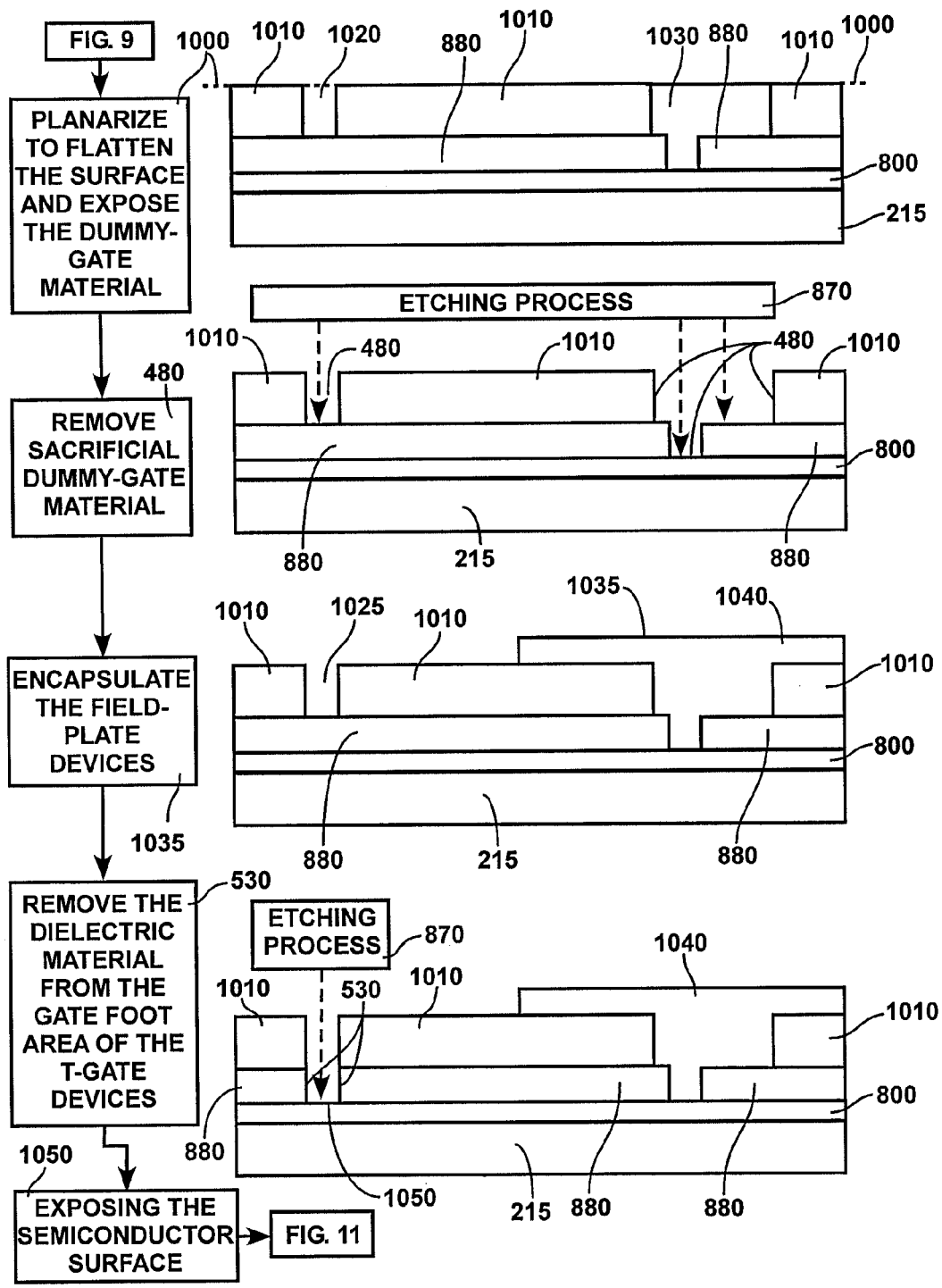
FIG. 10 shows for illustrative purposes only an example of surface planarization & sacrificial dummy-gate removal of one embodiment.

Surface Planarization & Sacrificial Dummy-Gate Removal:

FIG. 10 shows for illustrative purposes only an example of surface planarization & sacrificial dummy-gate removal in one or more embodiments. FIG. 10 shows processes continuing from FIG. 9. Shown in FIG. 10 is the single wafer 200 of FIG. 2, including the silicon carbide substrate 215 and containing the gallium nitride (GaN) epitaxial semiconductor layer 800. On the gallium nitride (GaN) epitaxial semiconductor layer 800 is the etched insulating dielectric layer 880. The process includes a planarization of the T-gate sacrificial dummy-gate structure 950, the field-plate sacrificial dummy-gate structure 960 and the encapsulating layer 975 of FIG. 9. The planarization process includes using a chemical-mechanical polishing (CMP) 470 of FIG. 4 to planarize to flatten the surface and expose the dummy-gate material 1000. The planarization process creates a planarized encapsulating dielectric layer 1010, planarized T-gate sacrificial dummy-gate structure 1020 and planarized field-plate sacrificial dummy-gate structure 1030 in one or more embodiments.

An etching process 870 including a wet-chemical etching process 310 of FIG. 3 can be used to selectively remove sacrificial dummy-gate material 480.

A lithography process may be used to encapsulate the field-plate devices 1035. A resist is deposited onto the planarized encapsulating dielectric layer 1010. A lithography process may be used to pattern the resist to create a protective encapsulated field gate structure pattern 1040. The etched T-gate structure pattern 1025 may be exposed in one or more embodiments.

An etching process 870 may be used in the step 530 to remove the insulating dielectric layer material from the gate foot area of the T-gate devices. The etch removal of the insulating dielectric layer material results in exposing the semiconductor surface 1050 of the gallium nitride (GaN) epitaxial semiconductor layer 800 in one or more embodiments.

Utilizing distinct steps to define the gate foot of field plated devices with lithography 820 and the gate foot area of the T-Gate devices 530 as in some embodiments allows the dimensions of the gate foot of each device to be formed independently from the other device. This can allow for greater flexibility in the dimensions for each device, and can therefore also accommodate for any misalignment that may arise in lithography processes that could compromise device performance.

Figure 11:
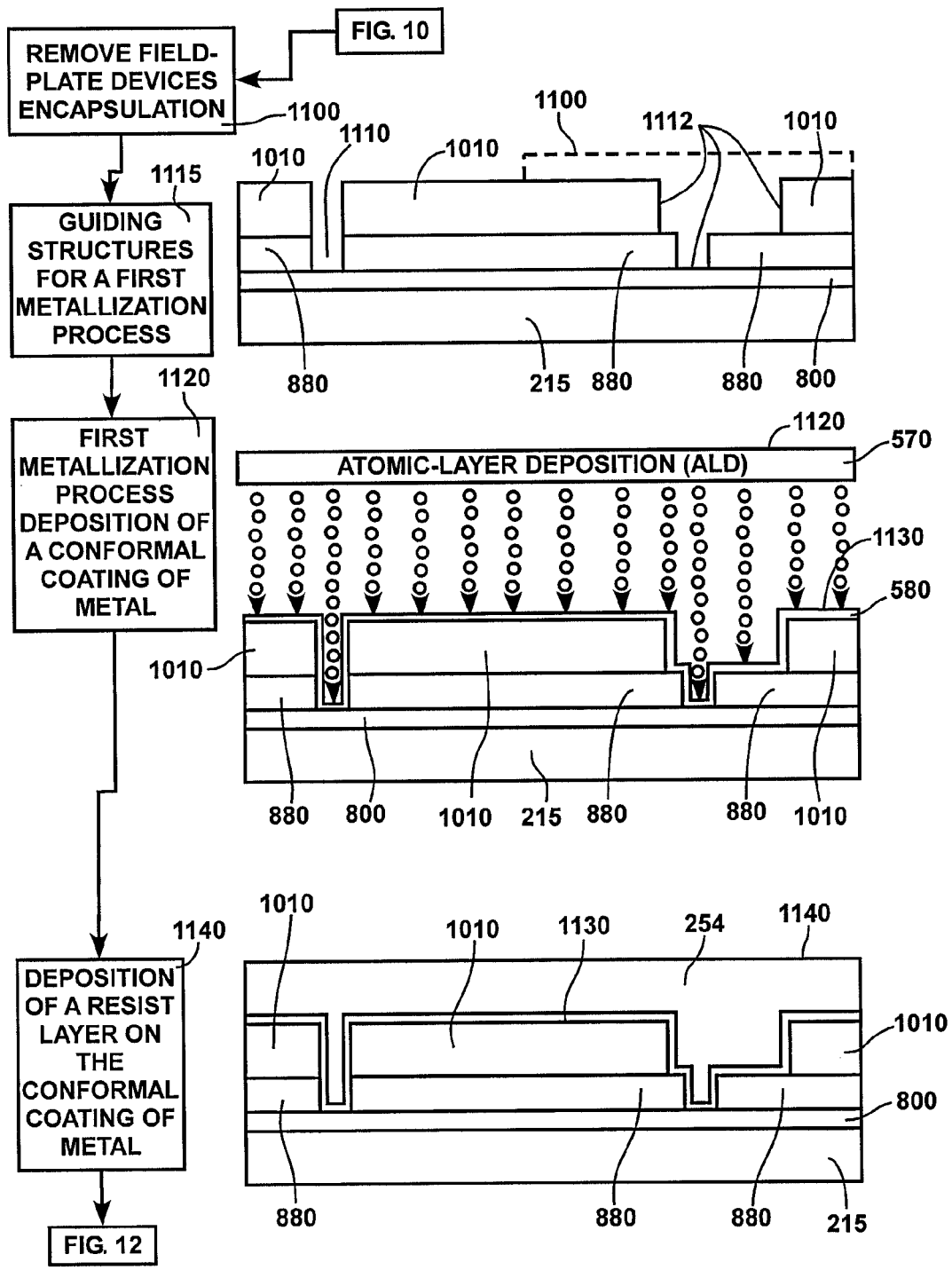
FIG. 11 shows for illustrative purposes only an example of first metallization process of one embodiment.

Descriptions of subsequent processes are shown in FIG. 11.

Metallization Process:

In some embodiments, a metallization process may be utilized. The metallization process can include a first and second metallization process in some embodiments. Utilizing first and second metallization processes can allow different metals to be deposited using different techniques. For example, the first metallization process can deposit a first metal using a first process, and the second metallization process can deposit a second metal using a second process. In some embodiments, a single metallization process may be utilized. In some embodiments, more than two metallization processes may be utilized. In some embodiments, the metallization process provides a plurality of metals.

FIG. 11 shows for illustrative purposes only an example of first metallization process in one or more embodiments. Continuing from FIG. 10, FIG. 11 shows the silicon carbide substrate 215, gallium nitride (GaN) epitaxial semiconductor layer 800, etched insulating dielectric layer 880 and planarized encapsulating dielectric layer 1010. A process may be used to remove field-plate devices encapsulation 1100. The removal of the field-plate devices encapsulation reveals a field-plate devices sacrificial dummy-gate feature guiding structure 1112. The etch removal exposing the semiconductor surface 1050 of FIG. 10 creates a T-gate devices sacrificial dummy-gate feature guiding structure 1110. The field-plate devices sacrificial dummy-gate feature guiding structure 1112 and the T-gate devices sacrificial dummy-gate feature guiding structure 1110 can be used as guiding structures for a first metallization process 1115 in one or more embodiments.

A first metallization process 560 of FIG. 5 includes a first metallization process deposition of a conformal coating of metal 1120. The deposit of a conformal coating of metal includes using the atomic-layer deposition (ALD) 570. A conformal coating of metal 1130 includes using a metal for example platinum (Pt) 580. A process may be used to create a deposition of a resist layer on the conformal coating of metal 1140. The deposition of a resist layer includes using a photo-resist 254 which covers the conformal coating of metal 1130 in one or more embodiments. The processing continues as described in FIG. 12.

Figure 12:
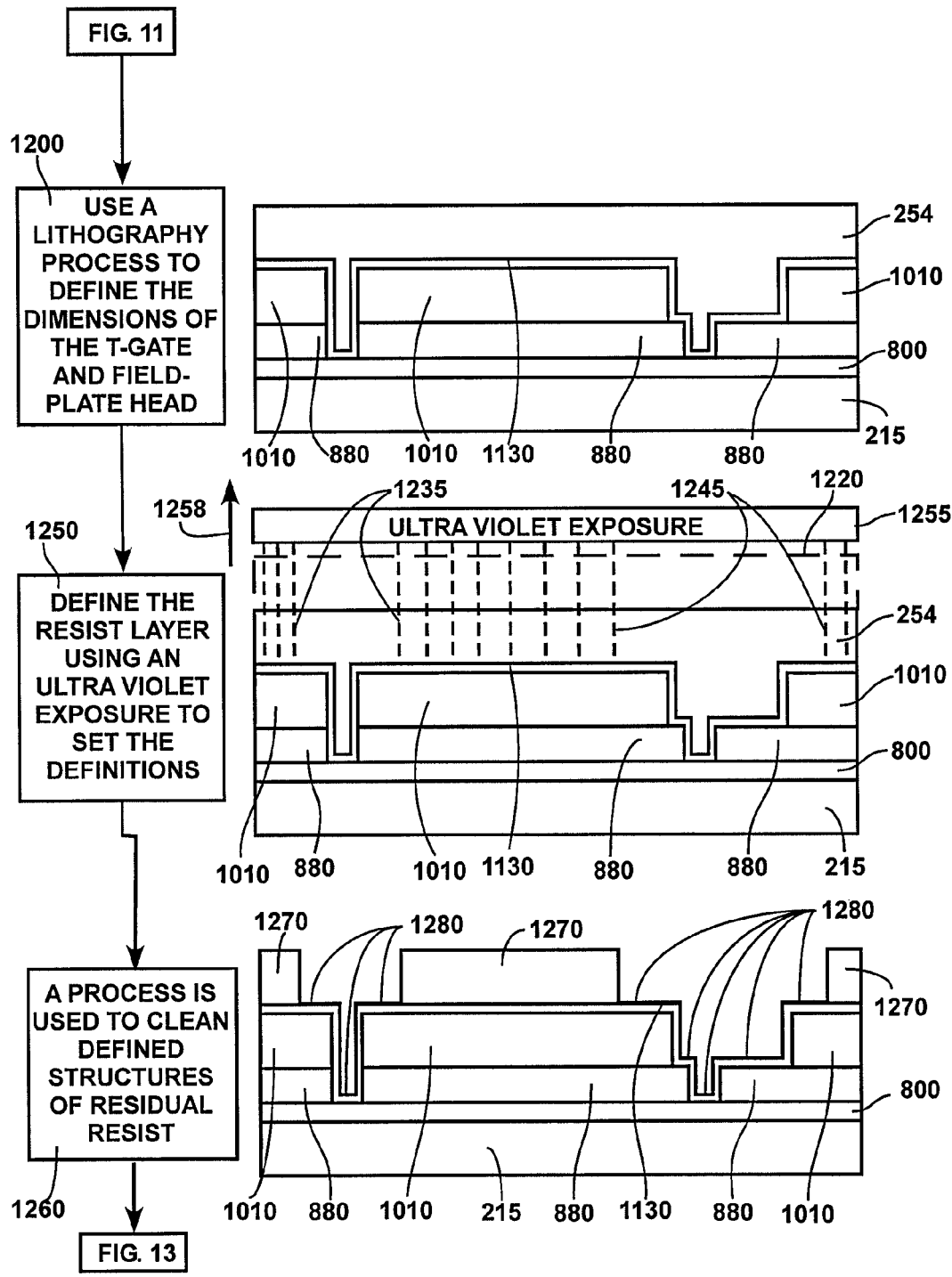
FIG. 12 shows for illustrative purposes only an example of defining T-gate and field-plate heads of one embodiment.

Defining T-Gate and Field-Plate Heads:

FIG. 12 shows for illustrative purposes only an example of defining T-gate and field-plate heads in one or more embodiments. FIG. 12 shows processing continuing from FIG. 11 including a process to use a lithography process to define the dimensions of the T-gate and field-plate head 1200. In some embodiments, dimensions for the gate heads are approximately 500 nm. Processing continues on the single wafer 200 of FIG. 2 that includes the silicon carbide substrate 215 and gallium nitride (GaN) epitaxial semiconductor layer 800. The etched insulating dielectric layer 880, planarized encapsulating dielectric layer 1010 and conformal coating of metal 1130 include a deposition of a resist such as a photo-resist 254, for example.

A lithography process 1250 may be used to expose the resist layer using an ultra violet exposure to set the definitions 1250. Ultra violet exposure 1255 creates a T-gate head definition 1235 and a field-plate head definition 1245 in the set resist layer.

A process 1260 may be used to clean defined structures of residual resist. Resist 1270 retains the dimensions of the gate heads and defines the T-gate and field-plate gate heads. A process to clean defined structures of resist 1280 may be used in preparation of the second metallization process 625 of FIG. 6 as described in FIG. 13 in one or more embodiments.

Figure 13:
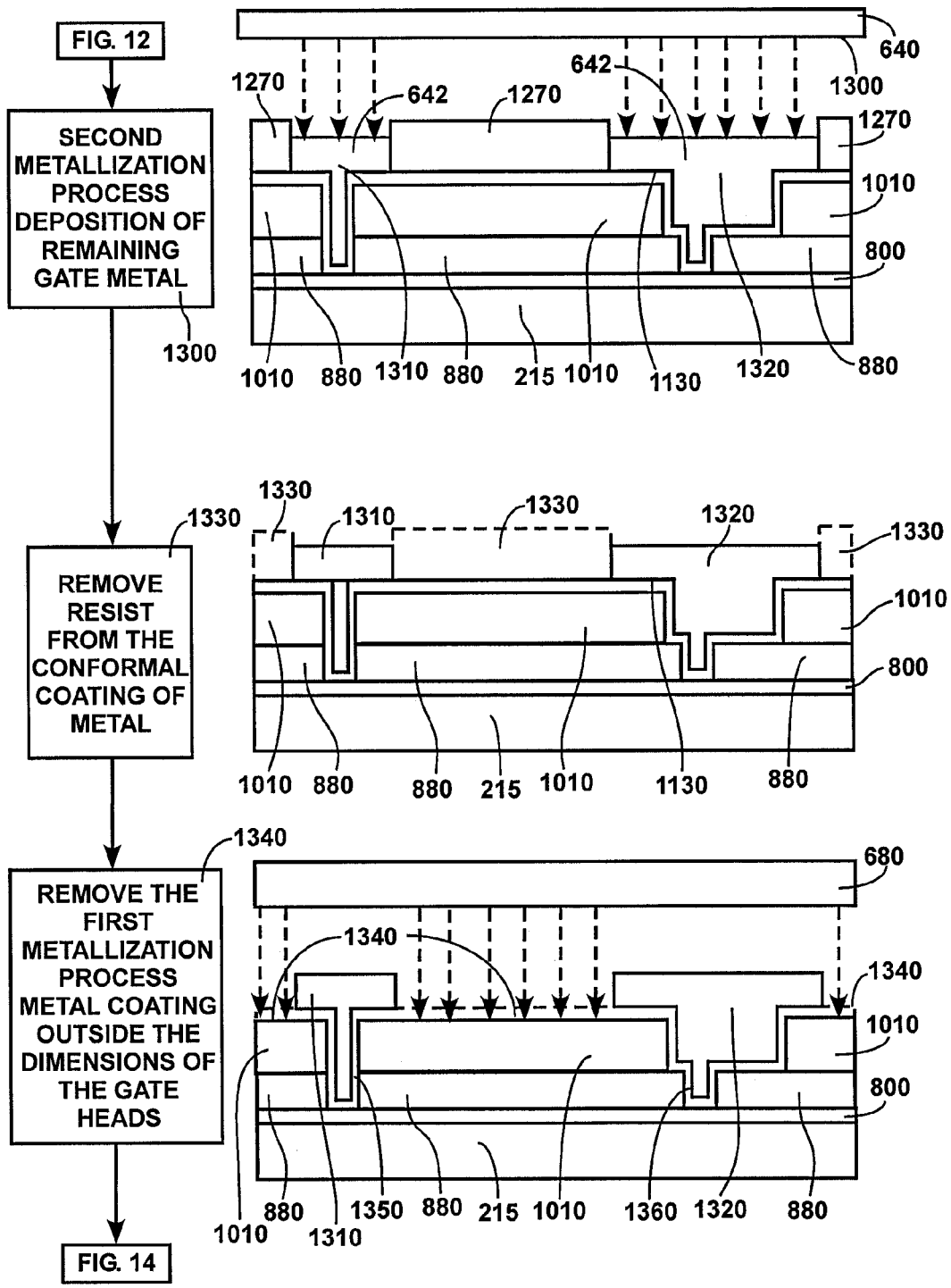
FIG. 13 shows for illustrative purposes only an example of second metallization process of one embodiment.

Second Metallization Process:

FIG. 13 shows for illustrative purposes only an example of second metallization process in one or more embodiments. FIG. 13 shows the second metallization process 625 of FIG. 6 and the process prepared for in FIG. 12. In FIG. 13, the processing continues with a second metallization process deposition of remaining gate metal 1300. The second metallization process deposition of remaining gate metal 1300 uses a metal deposition process including an electro-plating process 640 to deposit a predefined metal 590 of FIG. 5 which can include gold (Au) 642, for example. The electro-plating process 640 deposits the gold (Au) 642 within the guiding gate structures created by the resist 1270. The deposits of gold (Au) 642 include T-gate structure gate metal 1310 and field-plate gate structure gate metal 1320 on top of the conformal coating of metal 1130 in one or more embodiments.

The first metallization process metal layer may be the conformal coating of metal 1130 which acts as a membrane to initiate the electro-plating process 640 deposit of the remaining gate metal. This deposits the remaining gate metal within the T-gate devices sacrificial dummy-gate feature guiding structure 1110 of FIG. 11 and the field-plate devices sacrificial dummy-gate feature guiding structure 1112 of FIG. 11 created using the planarized encapsulating dielectric layer 1010 and the etched insulating dielectric layer 880 on the gallium nitride (GaN) epitaxial semiconductor layer 800 and the silicon carbide (SiC) substrate 215 of the single wafer 200 of FIG. 11 in one or more embodiments.

A process may be used to remove resist from the conformal coating of metal 1330 to uncover the T-gate structure gate metal 1310 and field-plate gate structure gate metal 1320. A process may be used to remove the first metallization process metal coating outside the dimensions of the gate heads 1340. The removal process used includes an ion-mill process 680. The remainder of the first metallization process metal coating comprises a T-gate structure conformal coating of metal 1350 and a field-plate gate structure conformal coating of metal 1360 in one or more embodiments. Processing descriptions continue in FIG. 14.

Figure 14:
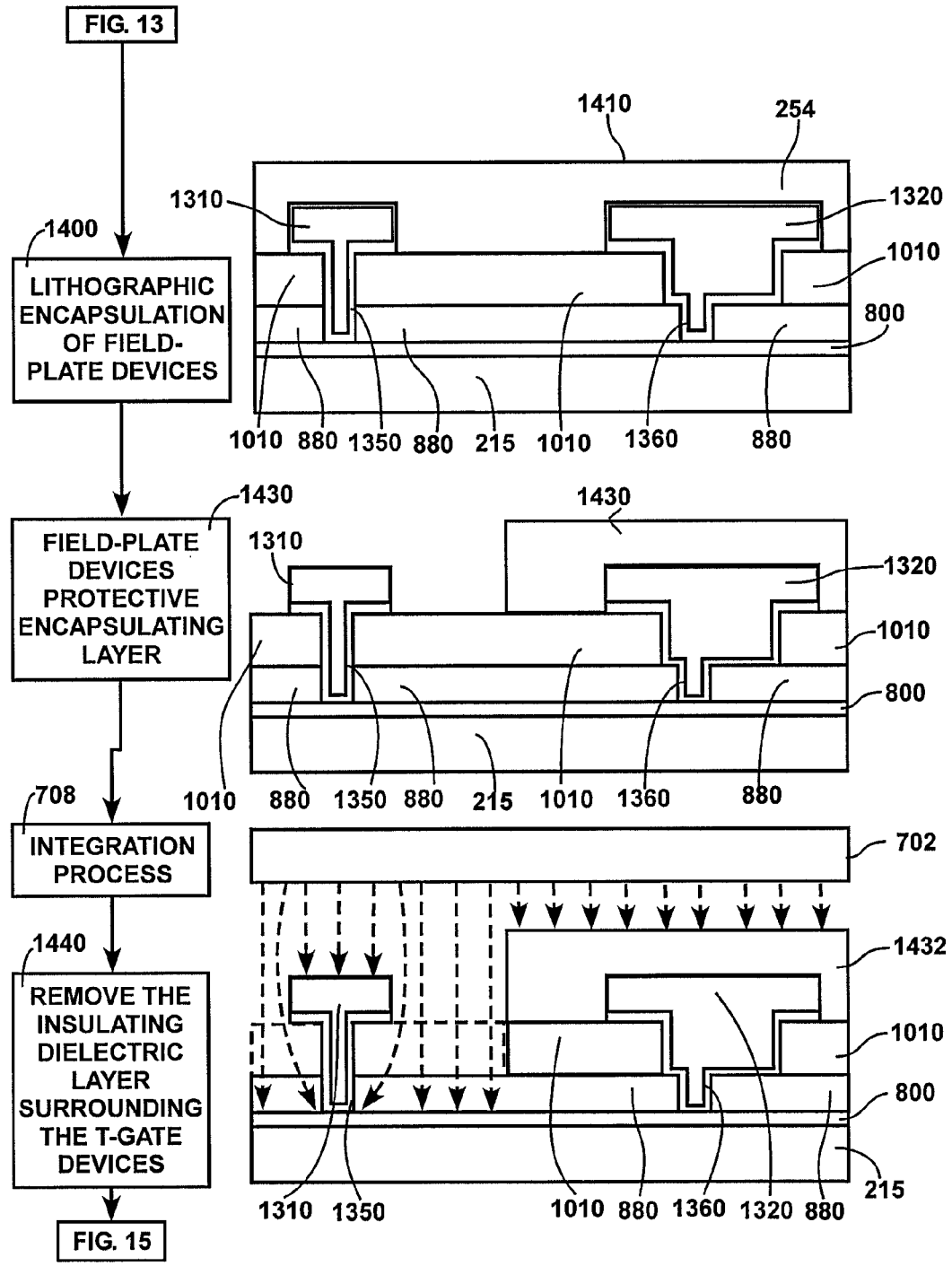
FIG. 14 shows for illustrative purposes only an example of an integration process of one embodiment.

An Integration Process:

FIG. 14 shows for illustrative purposes only an example of an integration process in one or more embodiments. The process described in and discussed with respect to FIG. 13 continues in FIG. 14. FIG. 14 shows a lithographic encapsulation of the field-plate devices 1400. An encapsulating resist layer deposition 1410 using, for example, a photo-resist 254 can be deposited onto the planarized encapsulating dielectric layer 1010, the T-gate structure gate metal 1310, and the field-plate gate structure gate metal 1320. The encapsulating resist layer deposition 1410 does not contact the etched insulating dielectric layer 880, gallium nitride (GaN) epitaxial semiconductor layer 800 and silicon carbide (SiC) substrate 215 in one or more embodiments.

The lithography process 1400 may be used to pattern the deposited resist 254. The resist also covers the exposed ends of the T-gate structure with conformal coating of metal 1350 and the field-plate gate structure with conformal coating of metal 1360. The lithography process 1430 creates a field-plate devices protective encapsulating layers 1350 and 1360. The field-plate devices protective encapsulating layer 1432 protects the field-plate gate structure gate metal 1320, T-gate structure conformal coating of metal 1350 and surrounding field-plate devices planarized encapsulating dielectric layer 1010 from etch processes to follow in one or more embodiments.

The integration process 708 begins with a process to remove the insulating dielectric layer surrounding the T-gate devices 1440. The process to remove the insulating dielectric layer surrounding the T-gate devices 1440 includes a wet-chemical etch 702. The wet-chemical etch 702 removes the planarized encapsulating dielectric layer 1010 and the etched insulating dielectric layer 880 surrounding the T-gate devices. The field-plate devices protective encapsulating layer 1432 protects the field-plate gate structure gate metal 1320, T-gate structure conformal coating of metal 1350 and surrounding field-plate devices planarized encapsulating dielectric layer 1010 from the effects of the wet-chemical etch 702 in one or more embodiments. Descriptions of processes to follow are in FIG. 15.

Figure 15:
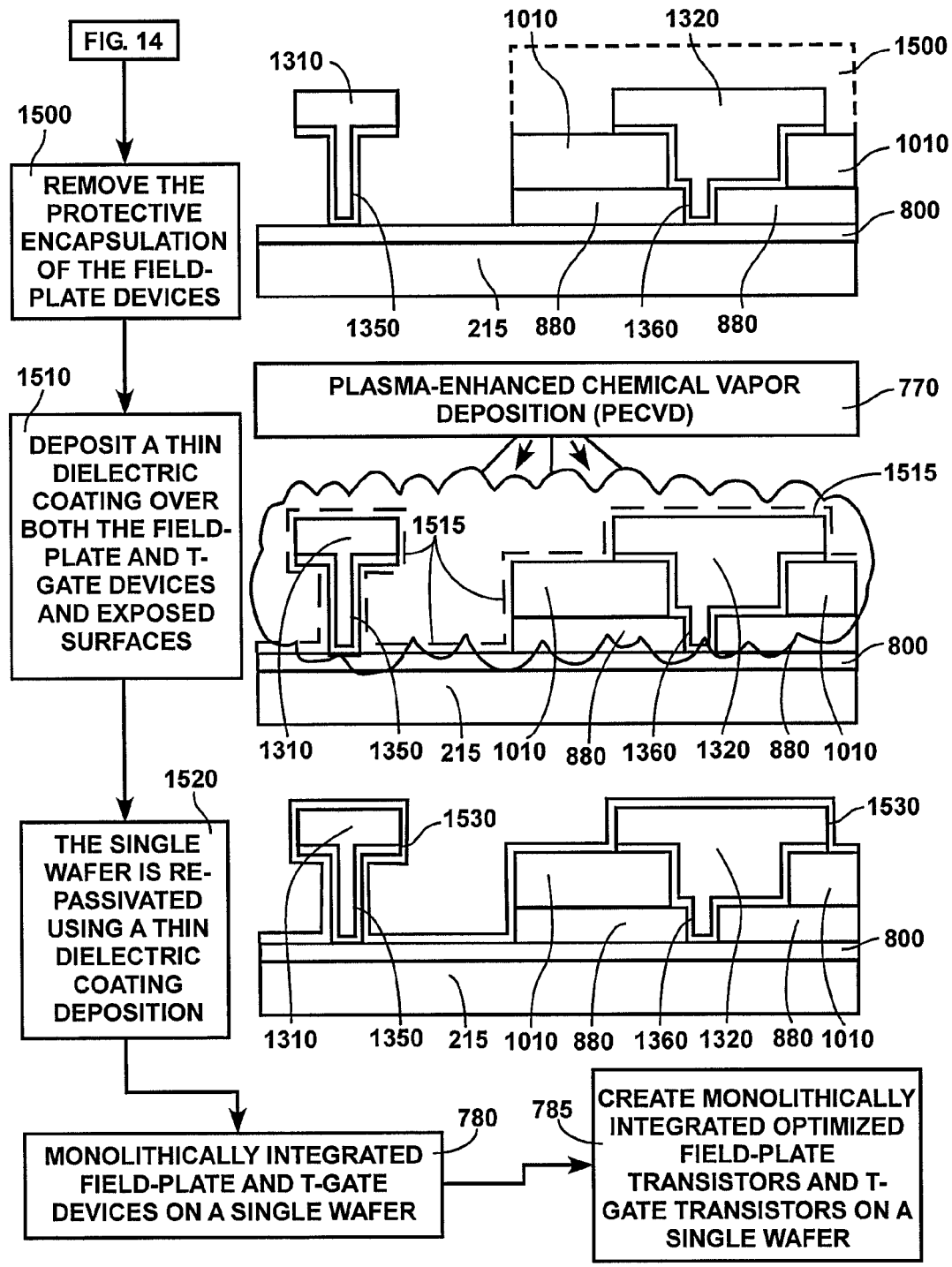
FIG. 15 shows for illustrative purposes only an example of monolithically integrated field-plate and T-gate devices on a single wafer of one embodiment.

Monolithically Integrated Field-Plate and T-Gate Devices on a Single Wafer:

FIG. 15 shows, for illustrative purposes only, an example of monolithically integrated field-plate and T-gate devices on a single wafer in one or more embodiments. FIG. 15 shows a continuation of processes from those shown in and discussed with respect to FIG. 14. FIG. 15 shows a continuation of the integration process 708 of FIG. 7 using a process to remove the protective encapsulation of the field-plate devices 1500. The removal of the protective encapsulation of the field-plate devices uncovers the field-plate gate structure gate metal 1320, the ends of the field-plate gate structure conformal coating of metal 1360 and portions of the planarized encapsulating dielectric layer 1010 and etched insulating dielectric layer 880 surrounding the field-plate devices.

Uncovered after the removal of the etched insulating dielectric layer 880, surrounding the T-gate devices can be portions of the T-gate structure gate metal 1310 and T-gate structure conformal coating of metal 1350. Also uncovered can be portions of the gallium nitride (GaN) epitaxial semiconductor layer 800 on top of the silicon carbide substrate 215 of the single wafer 200 of FIG. 2.

The integration process 708 of FIG. 7 includes a process to deposit a thin dielectric coating over both the field-plate and t-gate devices and exposed surfaces 1510. The process to deposit a thin dielectric coating over devices and exposed surfaces 760 includes using the plasma-enhanced chemical vapor deposition (PECVD) 770 process. A thin dielectric coating material deposition 1515 includes using a dielectric material including silicon nitride (SiN) 236 of FIG. 2.

The single wafer in a process step can be re-passivated using a thin dielectric coating deposition 1520. A thin dielectric coating 1530 covers the field-plate devices and T-gate devices created using the sacrificial dummy-gate structures. The completion of the integration process 708 of FIG. 7 creates monolithically integrated field-plate and T-gate devices on a single wafer 780. The monolithically integrated field-plate and T-gate devices on a single wafer 780 can be used to create monolithically integrated field-plate transistors and T-gate transistors on a single wafer 785.

The monolithically integrated field-plate transistors and T-gate transistors on a single wafer 785 can allow low-noise amplifiers have a lower noise figure when high-frequency T-gate devices are used, while power amplifiers have higher output power when field-plate devices with high breakdown voltage are used. The method of monolithically integrating a field-plate device and T-gate device on a single wafer produces integrated field-plate and T-gate devices on a single wafer to use to produce transistors used to fabricate multifunction monolithic microwave integrated circuit (MMIC) chips including transmit/receive (T/R) modules 790 and to optimize the performance of these and other electronic devices in one or more embodiments.

The foregoing has described the principles, embodiments and modes of operation. However, the disclosure should not be construed as being limited to the particular embodiments discussed. The above described embodiments should be regarded as illustrative rather than restrictive, and it should be appreciated that variations may be made in those embodiments without departing from the scope as defined by the following claims.

What is claimed is:

1. A method of monolithically integrating a field-plate transistor and T-gate transistor on a single wafer comprising:
   depositing an insulating dielectric layer onto a single wafer comprising a substrate and an epitaxial semiconductor layer;
   defining field-plate device and T-gate device sacrificial dummy-gate structures into the insulating dielectric layer and epitaxial semiconductor layer;
   removing the predefined sacrificial dummy-gate structures materials to create patterned features; and
   metalizing the field-plate device and T-gate device.

2. The method of claim 1, wherein depositing an insulating dielectric layer comprises plasma-enhanced chemical vapor deposition.

3. The method of 2 wherein the insulating dielectric layer comprises silicon nitride (SiN) configured to passivate the surface of the single wafer and support fabrication of the field-plate and T-gate devices on the single wafer.

4. The method of claim 1, wherein defining field-plate device and T-gate device sacrificial dummy-gate structures comprises defining a gate foot of field-plated devices using a resist and lithography process.

5. The method of 4 wherein the resist comprises a photo resist and the lithography process comprises photo lithography.

6. The method of claim 5, wherein the resist comprises an e-beam resist and the lithography process comprises e-beam lithography.

7. The method of claim 4, wherein the lithography process comprises an etching process.

8. The method of 7, wherein the etching process comprises one selected from the group consisting of wet chemical etching and dry plasma based etching.

9. The method of claim 7, further comprising removing the planarized sacrificial dummy-gate structures material by an etching process.

10. The method of claim 1, wherein defining field-plate device and T-gate device sacrificial dummy-gate structures comprises defining the dimensions of the sacrificial dummy-gate structures using a deposition of a resist layer.

11. The method of claim 10, wherein the resist layer comprises one selected from the group consisting of a photo-resist and an e-beam resist.

12. The method of claim 10, further comprising a lithography process to define the dimensions of a sacrificial dummy-gate structures into the resist layer.

13. The method of claim 1, wherein defining the field-plate device and T-gate device sacrificial dummy-gate structures comprises depositing an encapsulating layer and planarizing the sacrificial dummy-gate structures and encapsulating layer with a chemical-mechanical polishing (CMP) process to expose dummy-gate structures.

14. The method of claim 1, wherein metalizing the field-plate device and T-gate device comprises a first metallization process comprising depositing a predefined metal, depositing a resist layer, and defining the dimensions of the gate heads of the field-plate and T gate devices by a lithography process.

15. The method of claim 14, wherein the predefined metal comprises Platinum (Pt) and the deposition process comprises atomic-layer deposition (ALD).

16. The method of claim 14, wherein the metalizing the field-plate device and T-gate device further comprises a second metallization process to deposit a predefined gate metal in the defined gate heads.

17. The method of claim 1, further comprising integrating the field-plate and T-gate devices on the single wafer, the integrating comprising:
   including a protective encapsulation of the field-plate devices using a deposition of resist;
   protecting the field-plate devices using a protective resist layer and lithography process;
   removing the insulating dielectric layer surrounding the T-gate devices;
   removing the protective resist layer; and depositing of a dielectric coating on the field-plate and T-gate devices using a deposition.

18. The method of claim 1, wherein the sacrificial dummy-gate structure is configured to create guiding structures for a first metallization process including a conformal coating of metal using a deposition process including an atomic-layer deposition (ALD) of a predefined metal including platinum (Pt).

19. The method of claim 1, wherein the sacrificial dummy-gate structure is configured in a transmit/receive ("T/R") chip.

20. The method of claim 1, wherein a receiver (LNA) uses T-gate devices and a transmitter (PA) uses field plate devices.

21. The method of claim 1, wherein the sacrificial dummy-gate structures are configured in one or more selected from the group consisting of power amplifiers (PA's), one or more low noise amplifiers (LNA's), RF switches and mixers.

22. A monolithically integrated field-plate transistor and T-gate transistor on a single wafer comprising:
   a substrate;
   an epitaxial layer on the substrate;
   an insulating dielectric layer on the epitaxial layer;
   wherein the insulating dielectric layer and the epitaxial layer have a first feature configured for a field-plate device;
   wherein the field-plate device comprises first metal in the first feature;
   wherein the insulating dielectric layer and the epitaxial layer have a second feature configured for a T-gate device; and
   wherein the T-gate device comprises second metal in the second feature.

23. The device of claim 22, wherein the single wafer comprises a silicon carbide (SiC) substrate and an epitaxial semiconductor layer includes gallium nitride (GaN).

24. The device of claim 22, wherein the device is configured to provide low-noise amplifiers with a lower noise figure using the T-gate devices and to provide power amplifiers with higher output power using field-plate devices.

25. The device of claim 22, wherein the monolithically integrated field-plate transistor and T-gate transistor on a single wafer are configured to optimize performance of monolithic microwave integrated circuit (MMIC) chips.

26. The device of claim 22, wherein the device is used in one or more T/R modules.

27. The device of claim 22, wherein the device is used in one selected from the group consisting of Transmit/Receive (T/R) Modules, Power Amplifiers, Low-Noise Amplifiers, Mixers, RF Switches, and D to A converters.

* * * * *